United States Patent [19]
McClure

[11] Patent Number: 5,502,655
[45] Date of Patent: *Mar. 26, 1996

[54] DIFFERENCE COMPARSION BETWEEN TWO ASYNCHRONOUS POINTERS AND A PROGRAMMABLE VALUE

[75] Inventor: David C. McClure, Carrollton, Tex.

[73] Assignee: SGS-Thomson Microelectronics, Inc., Carrollton, Tex.

[ * ] Notice: The term of this patent shall not extend beyond the expiration date of Pat. No. 5,121,346.

[21] Appl. No.: 221,986

[22] Filed: Apr. 1, 1994

Related U.S. Application Data

[63] Continuation of Ser. No. 101,281, Aug. 2, 1993, abandoned, which is a continuation of Ser. No. 870,878, Apr. 20, 1992, abandoned, which is a continuation of Ser. No. 454,408, Dec. 21, 1989, Pat. No. 5,121,346, which is a continuation-in-part of Ser. No. 332,289, Mar. 31, 1989, abandoned.

[51] Int. Cl.$^6$ .................................................. G06F 19/00
[52] U.S. Cl. ...................................... 364/550; 365/189.01
[58] Field of Search ..................... 364/550; 365/189.01

[56] References Cited

U.S. PATENT DOCUMENTS

| | | | |
|---|---|---|---|
| 4,864,543 | 9/1989 | Ward et al. | 365/221 |
| 4,876,466 | 10/1989 | Kondou et al. | 307/465 |
| 4,888,739 | 12/1989 | Frederick et al. | 365/221 |
| 4,891,788 | 1/1990 | Kreifels | 365/49 |
| 4,933,840 | 6/1990 | Sera et al. | 364/200 |
| 4,935,719 | 6/1990 | McClure | 340/146.2 |
| 4,974,241 | 11/1990 | McClure et al. | 377/116 |
| 5,121,346 | 6/1992 | McClure | 364/550 |
| 5,206,817 | 4/1993 | McClure | 364/550 |

*Primary Examiner*—Edward R. Cosimano
*Attorney, Agent, or Firm*—Dennis T. Griggs; Kenneth C. Hill; Lisa K. Jorgenson

[57] ABSTRACT

A first-in first-out (FIFO) memory includes flag generation circuitry indicating the relative fullness of the memory. A write and a read counter count the number of read and write clock signals used to read to and write from the memory. A subtractor circuit receives the values in the counters as inputs, and generates a difference signal as an output. This difference signal is then compared to a program value, and a flag generated indicating the relative magnitudes of the difference value and the program value. Several different program values can be utilized to generate several different flags for the memory.

23 Claims, 10 Drawing Sheets

DIFFERENCE COMPARSION BETWEEN TWO ASYNCHRONOUS POINTERS AND A PROGRAMMABLE VALUE

REFERENCE TO RELATED APPLICATIONS

The present application is a continuation of Ser. No. 08/101,281, filed 02 Aug. 1993, abandoned, which is a continuation of Ser. No. 07/870,878, filed 20 Apr. 1992, abandoned, which is a continuation of Ser. No. 07/454,408, filed 21 Dec. 1989, issued as U.S. Pat. No. 5,121,346, which is a continuation-in-part of Ser. No. 07/332,289, filed 31 Mar. 1989, abandoned.

Reference is also made to a related application entitled "COMPARATOR CIRCUITRY", Ser. No. 07/332,288, filed Mar. 31, 1989, in the name of David Charles McClure, now U.S. Pat. No. 4,935,719, issued Jun. 19, 1990, and to a related application entitled "SYNCHRONIZATION CIRCUIT", Ser. No. 07/332,290, filed Mar. 31, 1989, in the names of David Charles McClure and Mark A. Lysinger, now U.S. Pat. No. 4,974,241, issued Nov. 27, 1990. These applications disclose and claim a comparator circuit and latch circuit respectively which are used in the preferred embodiment of the present invention, and are hereby incorporated by reference.

TECHNICAL FIELD OF THE INVENTION

The present invention is related generally to FIFO memories which require status flags that are user-programmable, and in particular to method and circuitry for measuring the relative difference between asynchronous pointers and a determination of whether the magnitude of a measured difference is greater, equal or less than a programmable value.

BACKGROUND OF THE INVENTION

First-in first-out (FIFO) memories receive data synchronized with a write clock and output data synchronized with a read clock, the read clock and write clock being asynchronous with each other. The FIFO memory has a plurality of serially arranged storage cells which are sequentially written into and read from. The term "write pointer" is used to indicate the storage cell presently being written into and the term "read pointer" is used to indicate the storage cell presently being read from.

In order for the FIFO memory to operate without creating bit errors, each storage cell must be alternately written into and then read from, i.e., no storage cell is written into twice in succession without an intermediate read operation and no storage cell is read from twice in succession without an intermediate write operation. In order to prevent this type of bit error from occurring, FIFO memories typically detect if the write pointer and the read pointer are separated by a predetermined number of memory cells and provide status flags at output terminals which indicate whether the memory is full or empty. By definition, the write pointer will always lead the read pointer since the data cannot be read until it is written.

In addition, because packets of data, for example, 1 byte of data, must often be transferred as a group, it is sometimes necessary to provide almost full and almost empty flags which detect, in this example, if the memory is 8 bits from full or 8 bits from empty. A half status flag which indicates if half or more of the memory has been written into without a succeeding read operation may also be desirable.

Because the read and write clocks which control the FIFOs are totally asynchronous, the proper detection of the state of the memory can be very difficult. Due to its asynchronous nature, the FIFO memory can be prone to arbitration problems as the clocks become skewed and operate at different frequencies.

DESCRIPTION OF THE PRIOR ART

Multiple counters have been generally used in the past to provide the status flags. These counters, one for the read clock and one for the write clock for each flag, may be preset to different values depending on the desired status flag. For a given flag, the output of a read counter and a write counter is compared, typically with an exclusive OR gate. If a matching condition is detected, a one-shot pulse is generated to toggle a latch indicating that if the FIFO was almost empty prior to the match, then it is no longer almost empty; and conversely, if the FIFO was not in the almost empty state, it is now in the almost empty state.

If the read and write counters were reset initially 8 apart, for example, then the actual matching condition of the counters signifies that the counts are, at that instant, different by 8. This could be used to generate an almost empty or almost full flag. To avoid an ambiguous flag definition, the matching condition is not enough to define the state of the flag. If only the matching condition were used, a count difference of 8 could signify both almost empty and not almost empty. The desired definition may state that 8 or less is almost empty, while 9 or more is not almost empty. To provide for this definition, one-shot pulses are generated based on the various transitions of the clocks. The state of the pulses, together with the matching condition, can detect if the matching condition has just been met (almost empty) or the condition was met on the previous cycle and the current cycle is a write cycle (going not almost empty). A flip-flop or latch is generally used which is set or reset upon encountering the combination of the matching condition of the counters and the state of the one-shot pulses generated from the read and write clocks.

The empty and full flags are somewhat easier to generate because once the matching condition is met, signifying empty for example, all subsequent reads are disabled until a valid write is completed. The converse is true for the full flag in that once the full condition is reached, all subsequent writes are disabled until a valid read is completed. As a result, the user never traverses on either side of the matching condition (about or below half full, for example) and the matching state designates the condition of empty (or full) unambiguously, while a non-matching condition clearly defines not empty (or not full). As a result, one-shot pulses are not necessary (except possibly to deglitch the output signal) and latched logic is not needed.

It will be appreciated that different types of logic are necessary for the full and empty flags compared to the almost and half full flags. Numerous counters are needed, reset to different initial states, to generate a number of status flags. This requires excess layout area, increases the loading on the read and write clocks, and increases on-chip noise and dynamic current due to the switching of multiple counters. Arbitration problems can arise if critical internal timing is not maintained and if the one-shot pulses are not carefully designed and shaped. This problem can arise when traversing back and forth across the matching condition of the counters, which is the point at which the flag is set or reset (almost and half full flags). If the flag is set or reset inappropriately, then because of the latched nature of the circuitry it will not recover until the matching condition is met again. This is not acceptable, as it may be necessary to continue on to a full (or empty) state with the flag set in the wrong position. The basic nature of the circuitry can make it non-recoverable if for any reason the flag goes in the wrong state for one cycle.

Because the read and write clocks which control the FIFO are totally asynchronous, the proper detection of the state of the memory can be very difficult. Due to its asynchronous nature, the FIFO can be prone to arbitration problems as the clocks become skewed and operate at different frequencies. Accordingly, a reliable high speed flag circuit is needed which is free of arbitration sensitivities and that can easily accommodate various status flags without a great deal of overhead circuitry.

The magnitude of the relative difference between various pointers provides useful information about the state of the information being used and how future operations could be performed in an optimum manner. Some systems may require that this difference threshold be varied on the fly, depending on the operation being performed, in which case a user programmable flag is desirable.

SUMMARY OF THE INVENTION

The present invention provides a flag circuit having a user-programmable flag reference value, which when exceeded or equaled by the relative difference between pointers, the flag is set. If the relative difference between pointers reduces below the reference value, then the flag will be reset.

A status flag having a programmable value utilizes the same read and write clocks and reset signals as used by the pointers. The clocks and their complement signals and reset signals are input to read and write counters. The counters produce read and write N-bit binary counts based on both the positive going edge and the negative going edge of the clocks. For some FIFO applications, it is necessary that for empty and almost empty flags, the write count be generated from the negative edge of the clock and the read count be generated from the positive edge of the clock. Conversely, for full, half full and almost full flags, the write count is generated from the positive edge of the clock and the read count is generated from the negative edge of the clock. The read and write count signals are fed into an N-bit subtractor which includes "N" full subtractors. Each difference output pair is input into a magnitude comparator. The same "N" number of magnitude comparator bits are used as are used for the subtractor. The comparator has a compare chain similar to the subtractor borrow chain in that it uses pass transistors, and is buffered and works from least significant bit to most significant bit. The compare chain uses the same inverter buffer arrangement as used for the subtractor.

The comparator compares a binary program value with the difference signal generated by the subtractor. If the binary values for the difference and program signals are equal, then the value on the compare chain from the previous compare bit is passed through. If the difference and program signals are different, then the program value is passed through. Ultimately, the last "bit" compare chain out represents the unfiltered flag output. Multiple magnitude comparators are used in parallel, with each having its own programmed binary reference value, to serve as flags.

Operational features and advantages of the present invention will be appreciated by those skilled in the art upon reading the detailed description which follows in connection with the attached drawings, wherein:

DESCRIPTION OF THE PREFERRED EMBODIMENT

Figure 9:
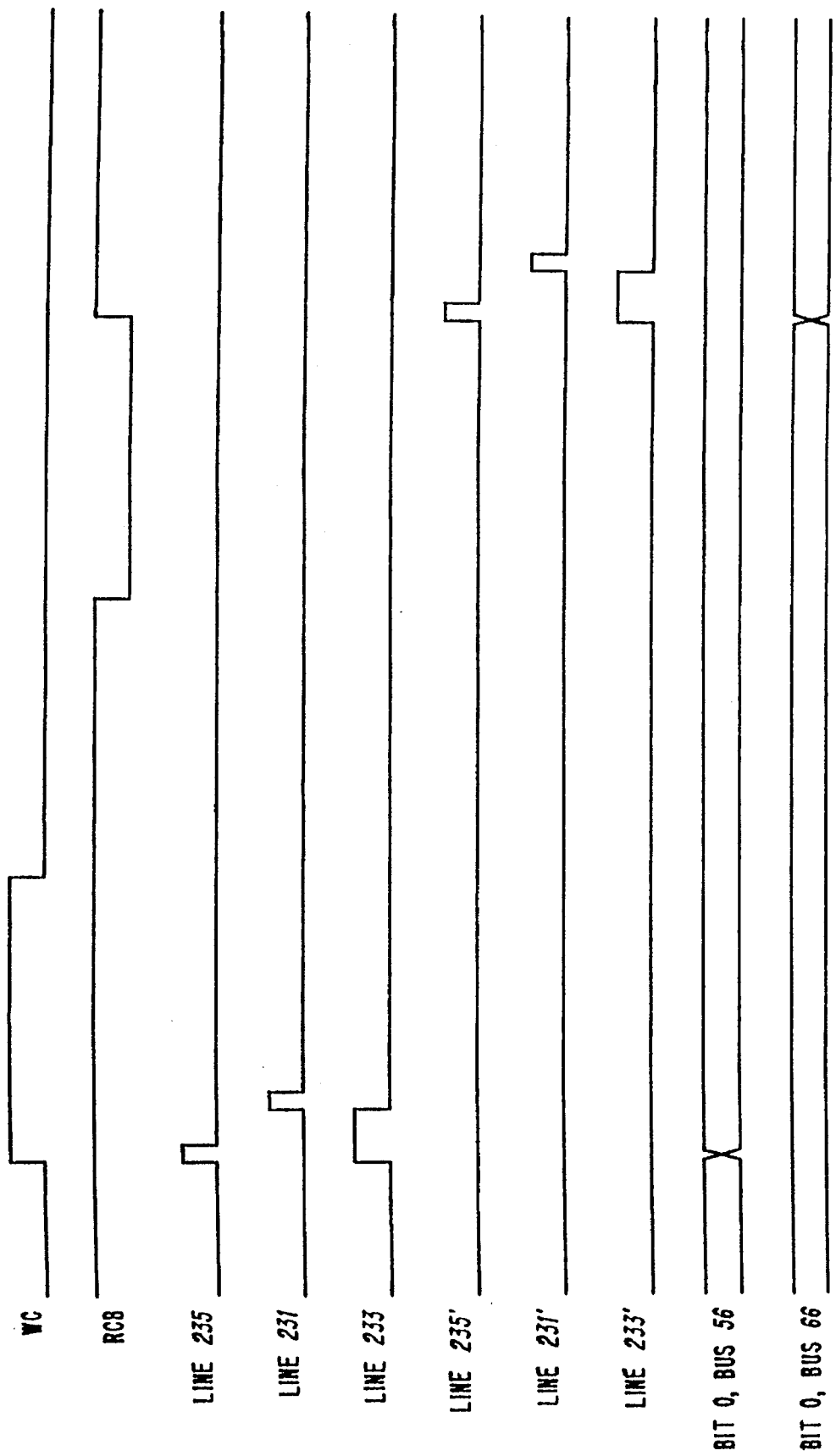
FIG. 9 is a timing diagram of certain signals occurring in FIGS. 2 and 8.

It will be appreciated that for purposes of clarity and where deemed appropriate, reference numerals have been repeated in the figures to indicate corresponding features, and that the timing signals shown in FIG. 9 have not necessarily been drawn to scale in order to more clearly show timing relationships in the preferred embodiment of the invention.

The circuitry for comparing the relative differences between two asynchronous pointers and a programmable value according to the preferred embodiment of the present invention is embodied in a flag generation circuit of a FIFO memory and includes two counters, a write counter and a read counter, a subtractor, a magnitude comparator, a deglitch circuit and a program select decoder. The flag generation circuit operates by counting the number of write clock signal and read clock signals and subtracting these two counts to form a difference signal. This difference signal is then compared in the comparator to a predetermined number and an unfiltered flag signal indicates the results of this comparison. The deglitch circuit operates to latch the output signal whenever the appropriate edge of either the write clock or the read clock is received and to keep the output signal from changing until the result of the received write clock or read clock signal has propagated through the counter, subtractor and comparator. After this blanking time, the output of the unfiltered flag signal is then passed to the flag output signal. The program select decoder makes the binary programmed value user-programmable as opposed to metal-programmable.

Figure 1:
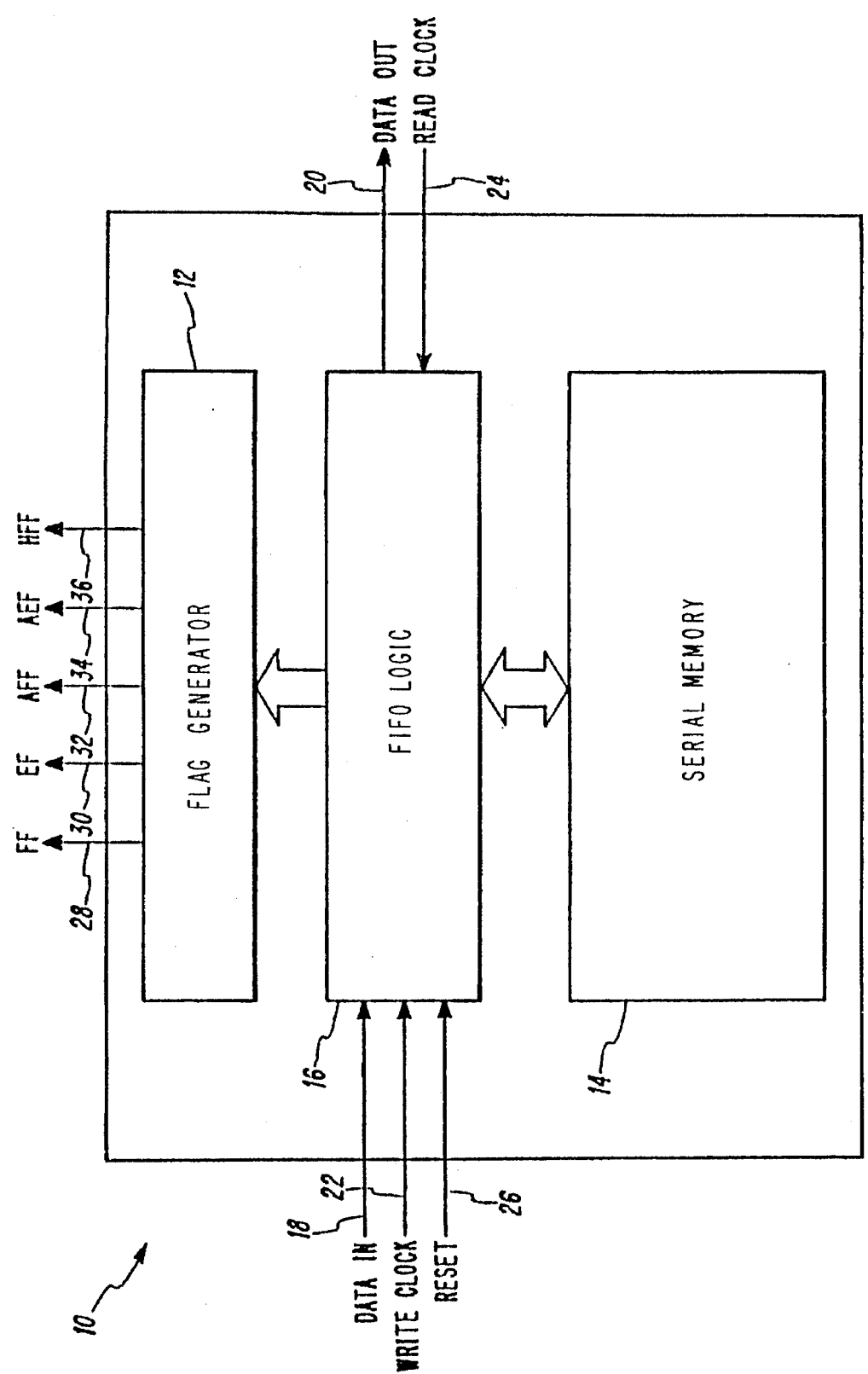
FIG. 1 is a block diagram of a FIFO memory which includes flag generation circuitry according to the present invention.

Turning now to the drawings, FIG. 1 is a block diagram of a FIFO memory 10 which includes circuitry 12 for generating the status flags for the FIFO 10. The FIFO 10 also includes a serial memory array 14 and logic circuitry 16 for providing interface circuitry between the various blocks of the FIFO 10.

As shown in FIG. 1, the FIFO 10 has a plurality of external terminals including a DATA IN terminal 18, a DATA OUT terminal 20, a WRITE CLOCK terminal 22, a READ CLOCK terminal 24, and a RESET terminal 26. The FIFO 10 also has a plurality of status flag signals including the full flag signal, FF, on terminal 28, and empty flag signal, EF, on terminal 30, an almost full flag signal, AFF, on terminal 32, an almost empty flag signal, AEF, on terminal 34, and a half full flag signal, HFF, on terminal 36.

The FIFO 10 operates by first being reset by a RESET signal on terminal 26 which resets the read pointer and the write pointer to the first memory cell in the serial memory array 14. At this point the empty flag signal on terminal 30 indicates that the FIFO 10 is empty and the almost empty flag signal on terminal 34 also indicates that the FIFO 10 is in the almost empty state, which in the preferred embodiment means that there are fewer than 8 memory cells between the write pointer and the read pointer that have been written into as their last operation. After the receipt of the first write clock signal on terminal 22, the empty flag signal on terminal 30 will cease to indicate an empty FIFO 10, but the almost empty signal on terminal 34 will continue to indicate an almost empty condition. After there are 8 more write clock signals than the number of read clock signals, then the almost empty flag signal on terminal 34 will cease to indicate an almost empty condition.

When the FIFO becomes half full, the half full flag signal on terminal 36 will indicate a half full status; and when the number of memory cells between the read pointer and the write pointer is 8 less than the maximum memory space, then the almost full flag signal on terminal 34 will indicate an almost full condition and the half full flag signal on terminal 36 will continue to indicate a half full condition. When the write pointer is pointing at the same cell as the read pointer such that all of the memory cells have been written into as their last operation, then the full flag signal on terminal 28 will indicate that the FIFO 10 is full of data, the almost full flag signal on terminal 34 will also indicate an almost full condition and the half full flag signal on terminal 36 will also indicate a half full condition.

Figure 2:
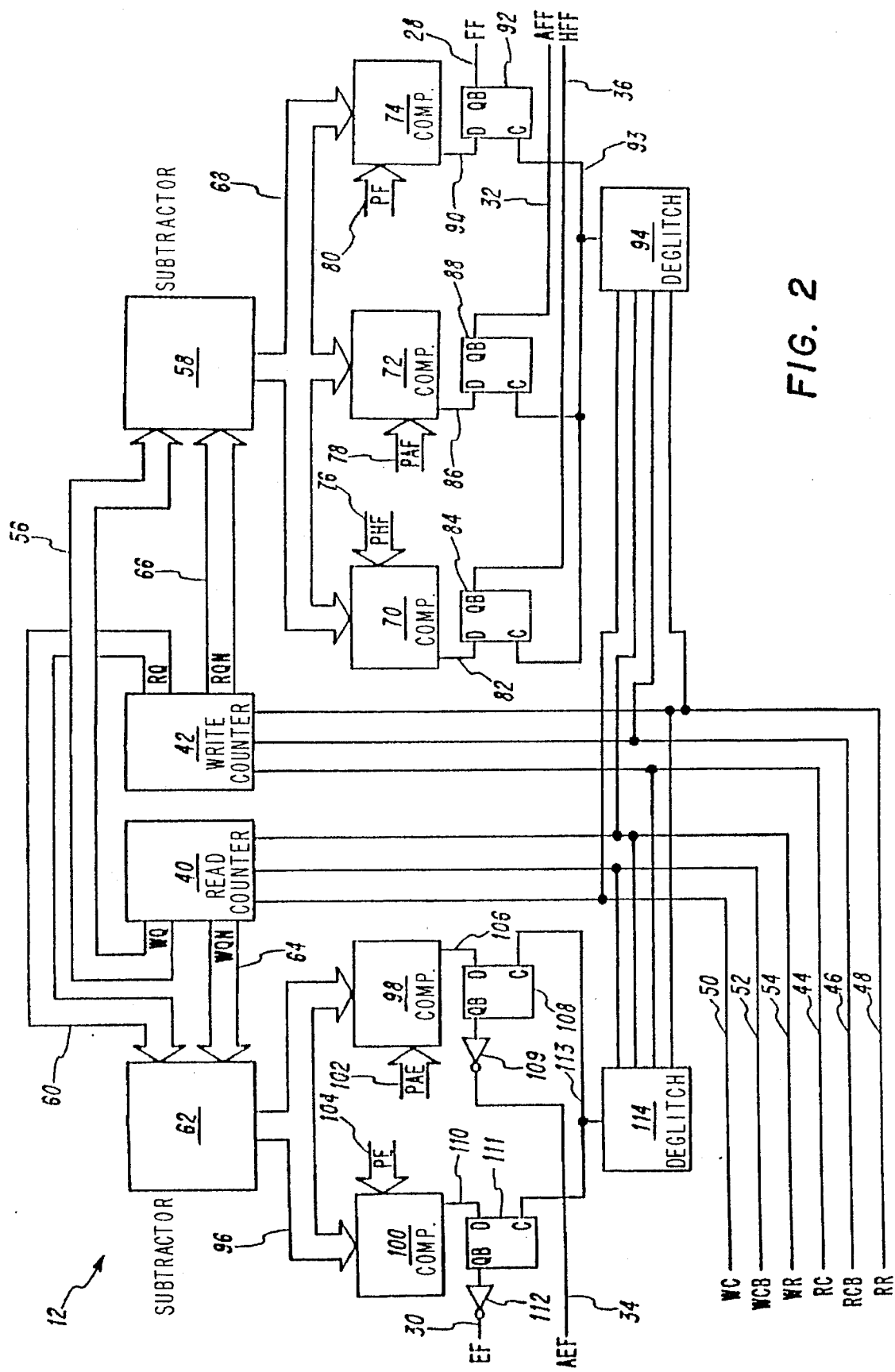
FIG. 2 is a block diagram of flag generation circuitry of the FIFO memory shown in FIG. 1.

FIG. 2 depicts a block diagram of the flag generation circuitry 12. The flag generation circuitry 12 includes a write counter block 40 and a read counter block 42. The read counter block 42 receives the read clock, shown as RC, on line 44 and the read clock bar signal, shown as RCB, on line 46. The read counter 42 also receives a reset signal, shown as RR on line 48. Similarly, the write counter 42 receives a write clock signal, shown as WC, on line 50, a write clock bar signal, shown as WCB, on line 52, and a write reset signal, shown as WR, on line 54.

Both the read counter block 42 and the write counter block 40 provide two sets of Q outputs, a first set, RQ and WQ, which changes on the initial edge of the clock pulse, and a second set, RQN and WQN, which changes on the trailing edge of the clock pulse. Thus, as shown in FIG. 2, the write counter block 40 has a WQ bus 56 containing the outputs of the write counter 40 which change on the initial edge of the clock pulse. The WQ bus 56 is input into a first subtractor block 58. A second output bus of the write counter block 40 is the WQN bus 64 which provides the outputs of the write counter 40 which change on the trailing edge of the write clock. The WQN bus 64 is input to a second subtractor block 62. In a similar manner, the read counter block 42 has a RQ output bus 60 which is input to the subtractor block 62, and an RQN output bus 66 which is input to the subtractor block 58.

The subtractor block 58 subtracts the value on the RQN bus 66 from the WQ bus 56 and provides a difference output on a difference bus 68. The difference bus 68 is input into almost full comparator block 72, and a full comparator block 74. The half full comparator block 70 has shown, for purposes of description, a program value bus input 76 shown as PHF. Similarly, the almost full comparator block 72 has a program value bus input 78, shown as PAF, and the full comparator block 74 has a program value bus input 80, shown as PF. In one embodiment, the flag program values PHF, PAF, and PF are encoded into the metallization layers of the FIFO memory 10 integrated circuit. In the preferred embodiment, the flag values PHF, PAF and PF are user-programmable and are stored electronically as binary numbers in registers as discussed hereinafter.

The output of the half full comparator block 70 is placed on line 82 which is connected to the D input of a latch 84. The output of the latch 84 forms the half full flag signal on terminal 36. The output of the almost full comparator block 72 is placed on a line 86 which is connected to the D input of another latch circuit 88, the output of which forms the almost full flag signal on terminal 32. The output of the full comparator block 74 is placed on line 90 which in turn is connected to the D input of a latch circuit 92, the output of which forms the full flag signal on terminal 28.

Clock inputs of the latches 84, 88 and 92 are connected together on a line 93 and the output of a deglitch circuit 94. The deglitch circuit 94 has as inputs the write clock signal on line 50, the read clock bar signal on line 46, and the two reset signals, write reset on line 54 and read reset on line 48.

The subtractor block 62 subtracts the count on the RQ bus 60 from the count on the WQN bus 64 and provides a difference signal on a difference bus 96. The difference bus 96 is connected to the input of an almost empty comparator block 98 and an empty comparator block 100. The almost empty comparator block 98 has a second input of a program value which, for purposes of description, is shown as a data bus 102 labeled PAE. Similarly, the empty comparator block 100 has a second input of a program value on a data bus 104 shown as PIE. In the preferred embodiment, the program values PAE and PE are encoded as binary numbers in registers within the FIFO memory 10 integrated circuit.

The output of the almost empty comparator block 98 is connected on a line 106 to the D input of a latch 108, the output of which is inverted by an invertor 109 to form the almost empty flag signal AEF on terminal 34. The output of the empty comparator block 100 is placed on a line 110 which is connected to the D input of a latch 111, the output of which is inverted by an inverter 112 to form the empty flag signal on terminal 30. Clock inputs of the latches 108 and 111 are connected together on a line 113 and to the output of a second deglitch circuit 114. This deglitch circuit 114 has as inputs the read clock signal on line 44, the write clock bar signal on line 52, and the two reset signals, write reset on line 54 and read reset on line 48.

In operation, the flag generation circuit 12 shown in FIG. 2 utilizes the write counter block 40 and the read counter block 42 to count the number of write clock pulses and read clock pulses respectively after these counters have been reset by the respective reset commands on lines 54 and 48. In the preferred embodiment, the FIFO memory 10 has 2048 storage cells requiring 11 data bits to specify the location of the write pointer or the read pointer. The counter blocks 40 and 42, the subtractor blocks 58 and 52, and the comparator blocks 70, 72, 74, 98 and 100 are 12 bits wide, the 12th bit being used to distinguish an empty FIFO condition from a full FIFO condition. In normal operation, both the write counter 40 and the read counter 42 are reset at the same time, but as will be understood by those skilled in the art, the write counter 40 or the read counter 42 are separately reset at times when it is desired to rewrite information into some of the memory cells or to reread information from some of the memory cells.

The subtractor block 58 is used in the generation of the half full, almost full and full flags at output terminals 36, 32 and 28, respectively. The subtractor block 58 receives the 12 bit count data on the WQ bus 56 from the write counter block 40, which data changes on the leading edge of the write clock signal, and receives the 12 bit count data from the read counter block 42 on the RQN bus 66, which count changes on the trailing edge of the read clock signal. These specific clock edges are used in the preferred embodiment to insure that the flag generation circuitry, in combination with the read and write control circuitry, do not cause the same memory cells to be written into or read from at the same time. The subtractor block 58 subtracts the read count on bus 66 from the write count on bus 56 and provides a difference on the difference bus 68. The half full comparator block 70, the almost full comparator block 72, and the full comparator block 74 compare this difference on bus 68 with a set of predetermined numbers, specifically the predetermined half full program value on bus 76, the predetermined almost full program value on bus 78, and the predetermined full program value on bus 80. The comparator blocks 70, 72 and 74 provide a logic 1 level on their outputs when the number on the difference bus 68 is less than the program value on the buses 76, 78 and 80.

In a similar manner, the subtractor block 62 subtracts the 12 bit count data on the RQ bus 60, which data changes on the leading edge of the read clock, from the 12 bit count data on the WQN bus 64, which number changes on the trailing edge of the write clock, to form the difference on the difference bus 96. The number in the difference bus 96 is compared to the PAE program value bus 102 in the almost empty comparator block 98 and the PE program value on bus 104 in the empty comparator block 100. The comparator blocks 98 and 100 operate in the same manner as the comparator blocks 70, 72 and 74. That is, when the difference is less than the program value in the output of the respective comparator blocks 98 or 100 will be a logic 1 level. The output of the comparator blocks 98 and 100 is passed through the latch circuits 108 and 111 and then through the inverters 109 and 113 respectively to form the almost empty flag signal on terminal 34 and the empty flag signal on terminal 30.

In the preferred embodiment, the program values are the following:

| Program Value Bus | Program Value |
|---|---|
| PE | 1 |
| PAE | 8 |
| PHF | 1025 |
| PAF | 2041 |
| PF | 2048 |

With these program values, the flag signals on the output terminals 28–36 will have the following logic levels:

| Difference on Bus 68 or 96 | EF(30) | AEF(34) | HFF(36) | AFF(32) | FF(28) |
|---|---|---|---|---|---|
| 0 | 1 | 1 | 0 | 0 | 0 |
| 1 | 0 | 1 | 0 | 0 | 0 |
| 2-7 | 0 | 1 | 0 | 0 | 0 |
| 8 | 0 | 0 | 0 | 0 | 0 |
| 9-1024 | 0 | 0 | 0 | 0 | 0 |
| 1025 | 0 | 0 | 1 | 0 | 0 |
| 1026-2040 | 0 | 0 | 1 | 0 | 0 |
| 2041 | 0 | 0 | 1 | 1 | 0 |
| 2042-2047 | 0 | 0 | 1 | 1 | 0 |
| 2048 | 0 | 0 | 1 | 1 | 1 |

The deglitch circuits 94 and 114, described in detail below, operate to separate or isolate the output flag signals 28, 30, 32, 34 and 36 from the outputs of the comparator blocks 70, 72, 74, 98 and 100 during the time that false signals may appear on these outputs. More specifically, the deglitch circuit 94 provides a one-shot pulse to the clock inputs of the latches 84, 88 and 92 upon detecting the leading edge of a write clock pulse or the trailing edge of a read clock pulse. The width of the one-shot pulse is enough to compensate for the delay through the write counter block 40 and read counter block 42, the subtractor block 48 and the comparator blocks 70, 72 and 74. The deglitch circuit 114 operates in a similar manner by providing a one-shot pulse to the latches 108 and 111 upon the detection of a rising edge of the read clock pulse or the trailing edge of the write clock pulse. The latch circuits 84, 88, 92, 108 and 111 pass the data from their output signal from the deglitch circuits 94 and 114 are at a logic 0 level and isolate the outputs from the inputs during the time that the output signals from the respective deglitch circuits are at a logic 1 level, i.e., when the one-shot pulse is present.

Figure 3:
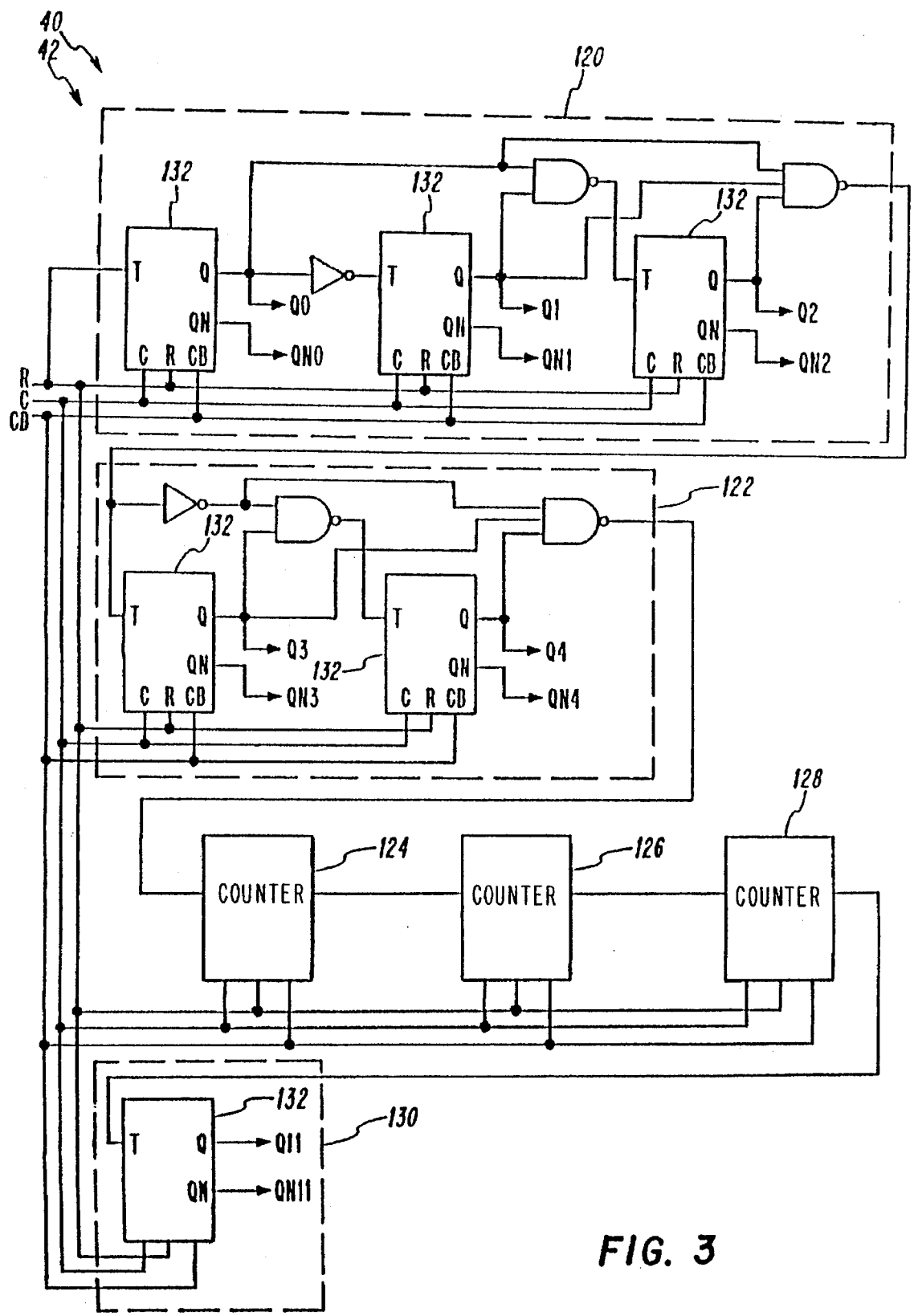
FIG. 3 is a logic diagram of a counter block shown in FIG. 2.

FIG. 3 is a logic diagram of the write counter block 40 and the read counter block 42. The counter blocks 40 and 42 are 12 stage counters which, for purposes of analysis, are divided into 6 sections: the first section 120 consisting of three stages; the second, third, fourth and fifth sections, shown as element numbers 122, 124, 126 and 128, are identical and each contain two stages; and the last section 130 containing a single stage. Each stage of the counter blocks 40 and 42, as shown in FIG. 3, uses a T flip-flop 132, and the stages are interconnected in a manner which will be easily understood by those skilled in the art. The counter blocks 40 and 42 have the advantage of using only two and three input NAND gates for coupling between the stages.

Figure 4:
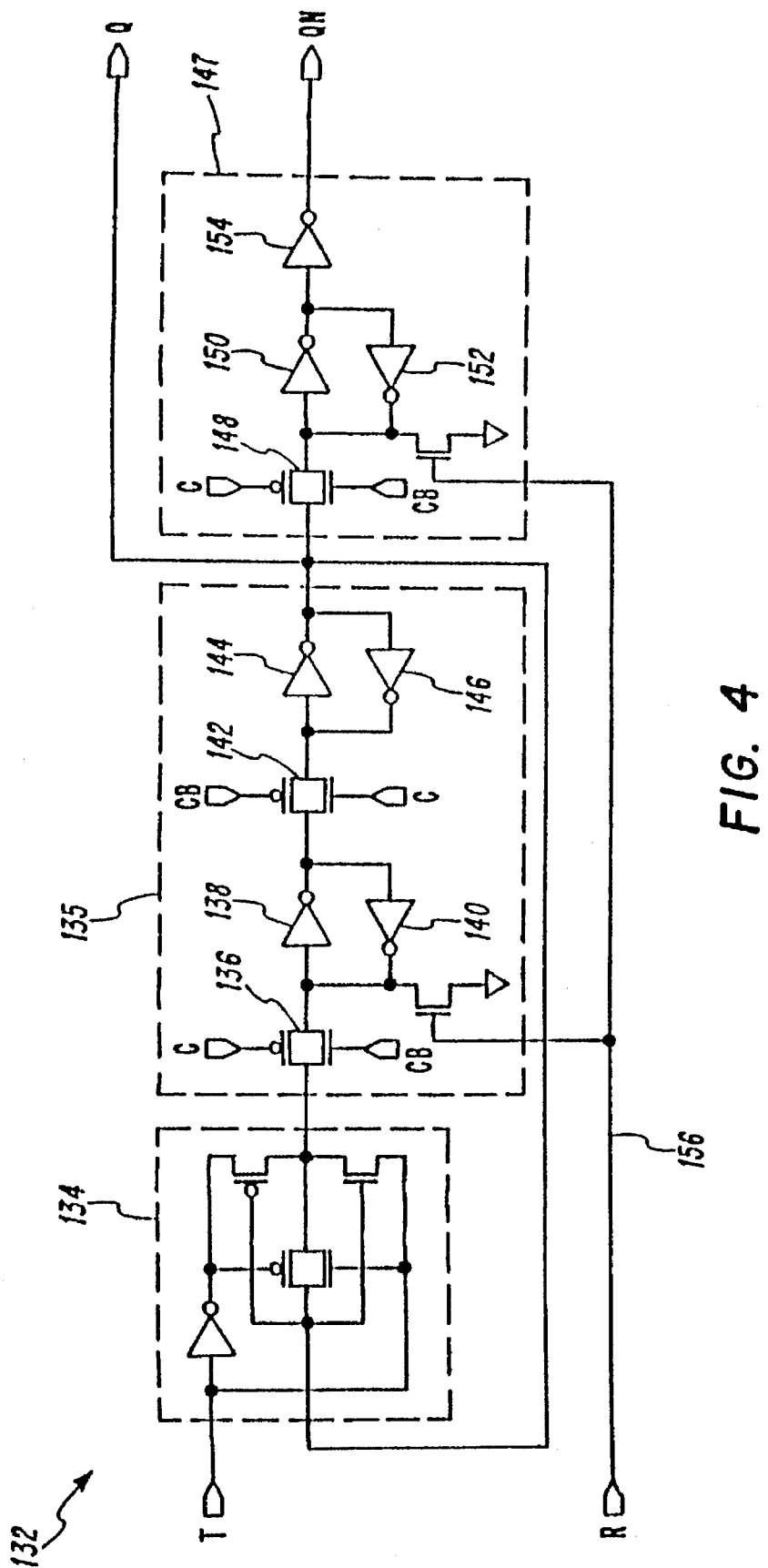
FIG. 4 is a logic diagram of a T flip-flop shown in FIG. 3.

The logic diagram of the T flip-flop 132 used in the counter blocks 40 and 42 is shown in FIG. 4. The Q and QN outputs of the T flip-flop 132 toggles upon the receipt of a clock pulse if the T input is a logic 0 level and does not toggle if the T input is a logic 1 level. Advantageously, the Q output toggles on the leading edge of the clock pulse which, in the preferred embodiment, is when the clock or C input is rising and the clock bar or CB input is falling, while the QN output changes on the trailing edge of the clock pulse which, in the preferred embodiment, is when the C input is falling and the CB input is rising. As shown in FIG. 4, the T input is combined with the Q output of the T flip-flop 132 in an exclusive NOR gate 134. The output the exclusive NOR gate 134 is connected to the D input of a D flip-flop 135 consisting of a first transmission gate 136 followed by two back-to-back inverters 138 and 140 followed by a second transmission gate 142 followed by another pair of back-to-back inverters 144 and 146. The output of the inverter 144 then forms the Q output of the T flip-flop 132. The exclusive NOR gate 134 and the D flip-flop 135 operate in a conventional manner and are known in the art. Connected to the output of the D flip-flop 135 is a latch stage 147 which includes another transmission gate 148 followed by two back-to-back inverters 150 and 152. The output from the inverter 150 is inverted by an inverter 154 to form the QN output.

As shown in FIG. 4, since the transmission gate 142 is conductive when the clock input is logic 1 level and the clock bar input is a logic 0 level, the Q output changes on the rising edge of the clock signal. In contradistinction, however, the transmission gate 148 is conductive when the clock input is a logic 0 level and the clock bar input is a logic 1 level, and therefore, the QN output changes on the trailing edge of the clock signal. The reset input on line 156, when it is a logic 1 level, forces both the Q and QN outputs to a logic 0 level (provided that the clock input rises to a logic 1 level and the clock bar input is a logic 0 level during the time that the reset input is a logic 1 level).

Figure 5:
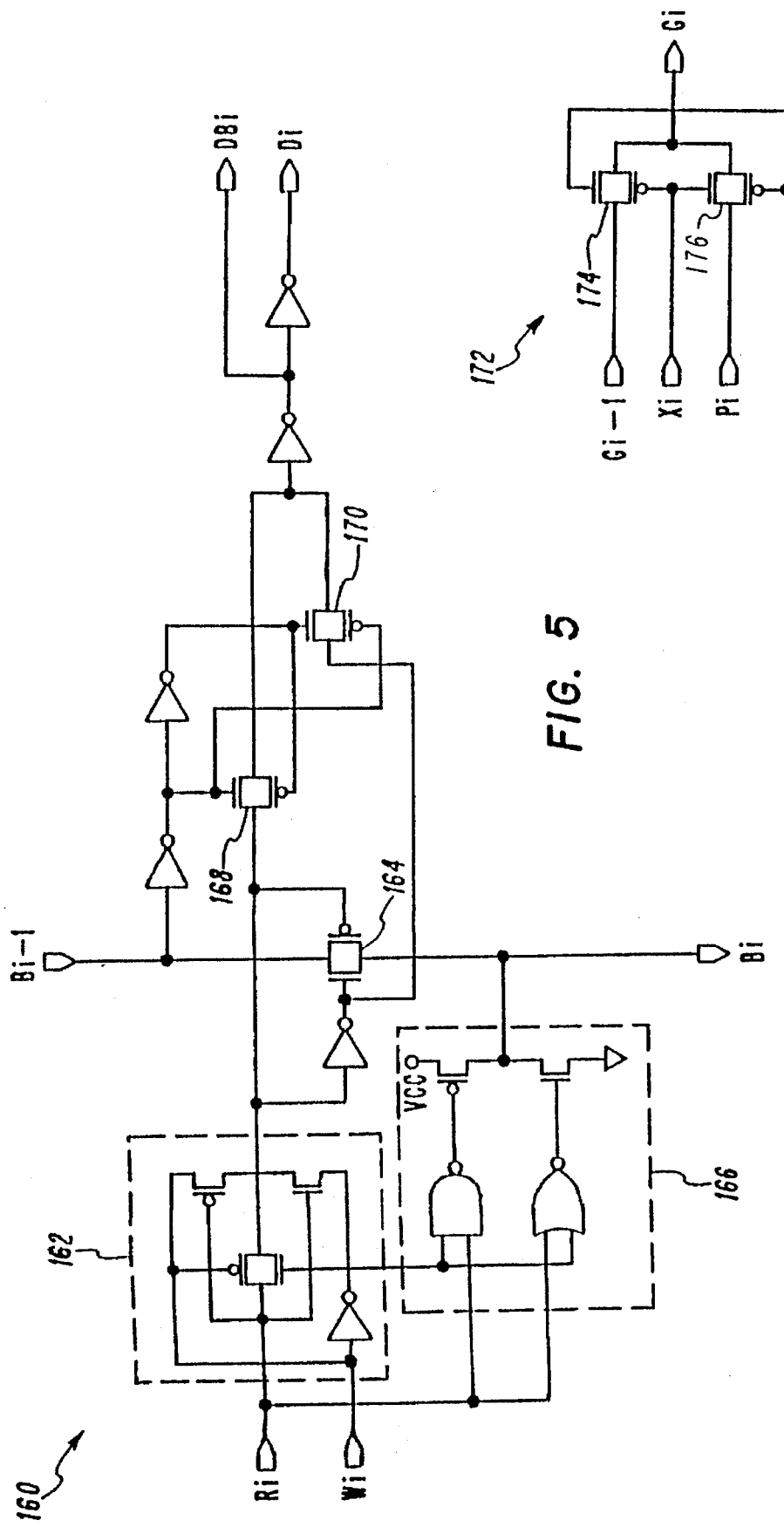
FIG. 5 is a logic diagram of a subtractor circuit of a subtractor block shown in FIG. 2.

A logic diagram of a subtractor circuit 160 which forms each stage of the subtractor blocks 58 and 62 is shown in FIG. 5. The subtractor circuit 160 subtracts the Ri input from the Wi input and combines this result with the borrow signal input shown as Bi-1, and provides true and complement difference outputs Di and DBi, respectively, and a borrow output signal Bi. The Ri and Wi inputs are combined in an exclusive OR gate 162, the output of which controls a transmission gate 164 which either passes the borrow input Bi-1 from the previous stage to the borrow output and to the next stage or isolates the Bi-1 input from the next stage. A high impedance driver circuit 166 receives the Ri input and the inverse of the Wi input to drive the Bi signal when the transmission gate 164 is non-conductive, and to provide a high impedance state when the transmission gate 164 is conductive and Bi-1 is transferred to borrow output Bi and the output of the high impedance drive circuit 166 is in the high impedance state. When the Ri and Wi are not at the same logic level, then the transmission gate 164 is non-conductive and the output state of the high impedance driver 166 will be a logic 1 level if Ri is logic 1 level and Wi is a logic 0 level, and conversely, will be a logic 0 level if Wi is a logic 1 level and Ri is a logic 0 level. The output of the exclusive OR gate 162 is passed through one of the transmission gates 168 and 170, which are controlled by the borrow input Bi-1 signal, to form the true Di output and the complement DBI output.

Figure 6:
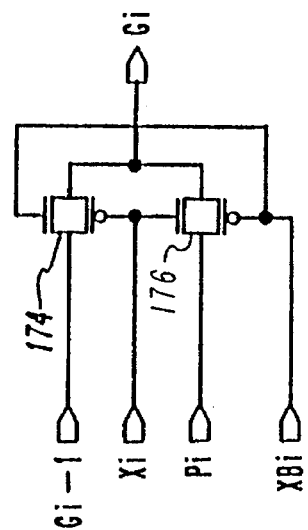
FIG. 6 is a circuit diagram of a comparator circuit of a comparator block shown in FIG. 2.

FIG. 6 is a logic diagram of a comparator circuit 172 which forms one stage of the comparator blocks 70, 72, 74, 98 and 100. The comparator circuit 172 consists of two transmission gates 174 and 176. One of two inputs Gi-1 or Pi are transmitted to the output Gl depending on the conductive state of the two transmission gates 174 and 176. The conduction of the transmission gates 174 and 176 is controlled by the true and complement input signals Xi and XBi of comparator 172. When Xi is a logic 0 level and XBi is a logic 1 level, then the Gi-1 input is passed to the Gi output and the Pi input is isolated from the Gi output. Conversely, when the Xi input is a logic 1 level and the XBi input is a logic 0 level, then the Pi input is passed to the Gi output and the Gi-1 input is isolated from the Gi output.

Figure 7:
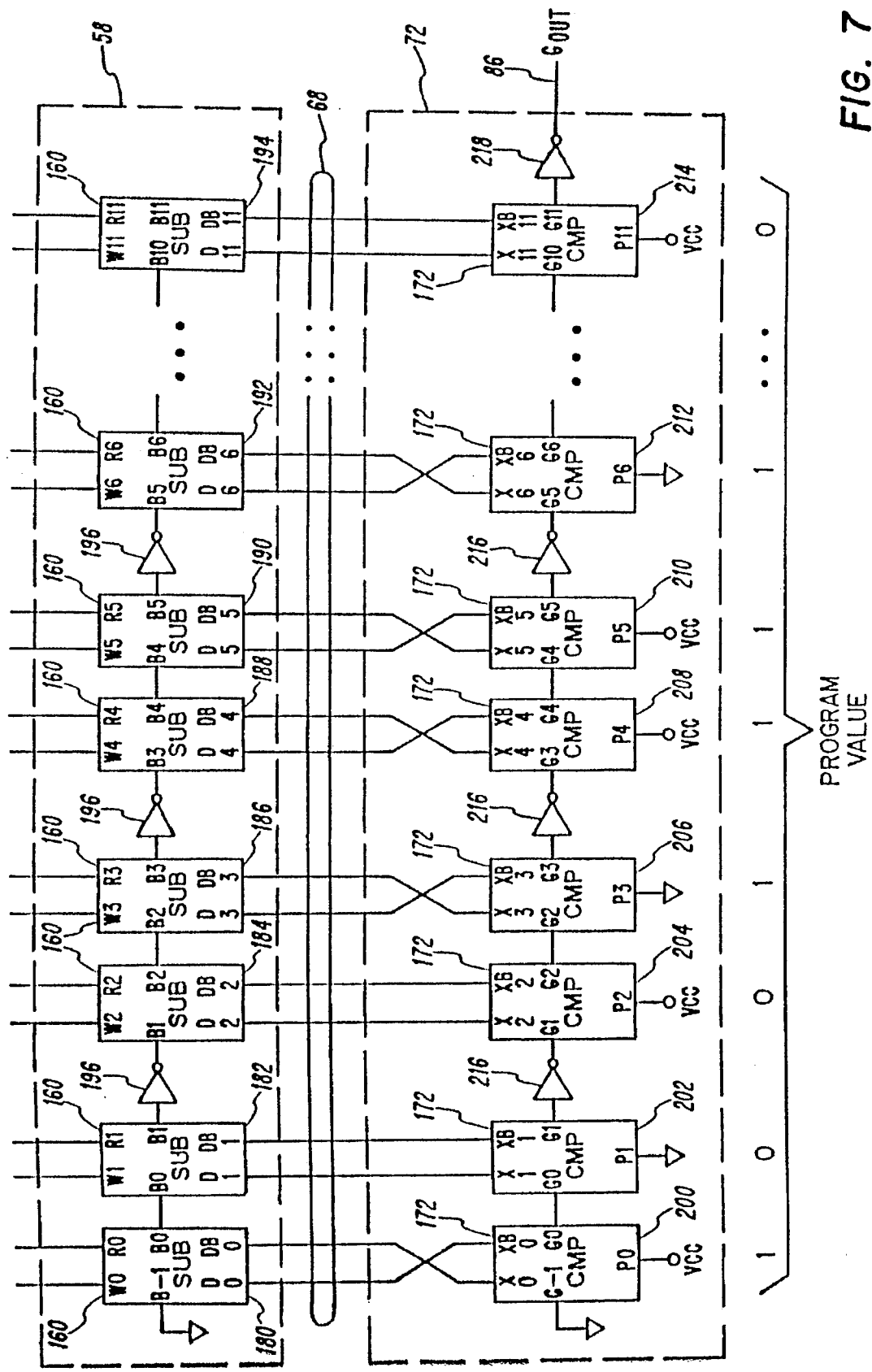
FIG. 7 is a block diagram of a subtractor block and comparator block shown in FIG. 2.

Turning now to FIG. 7, the subtractor block 58 and the almost full comparator block 72 are shown in more detail. The subtractor block 58 consists of 12 subtractor circuits 160. Each of the subtractor circuits 160 has a Wi input from the corresponding data line on the WQ bus 56 and a Ri input from the corresponding data line on the RQN data bus 66. In FIG. 7, the subtractor circuit 160 which generates the least significant bit of the difference is shown on the lefthand side of the drawing as element number 180, with the next least significant bit generated by the next subtractor circuit 182, with the subtractor circuits for the next more significant bits shown as element number 184, 186, 188, 190, 192 and element number 194 designating the subtractor circuit 160 for the most significant bit of the subtractor block 58.

The borrow chain runs horizontal through FIG. 7 with the borrow input of the subtractor circuit 180 connected to ground, and the borrow output connected to the borrow input of the subtractor circuit 182. The borrow output of the subtractor circuit 182 is connected to the input of an inverter 196, the output of which is connected to the borrow input of the subtractor circuit 184. In a similar manner, an inverter is connected to the borrow chain between every other subtractor circuit 160 and the next subtractor circuit 160 in the chain. The inverters 196 are required because the borrow input is transferred to the borrow output in the subtractor circuits 160 through only a transmission gate, and thus, the inverters 196 are required to amplify the borrow signal through the subtractor block 58.

The effect of the inverters 196 is to cause the borrow signal to be inverted in every other set of two subtractor circuits 160 in the subtractor block 58. Thus, in FIG. 7, the subtractor circuits 184, 186, 192 and 194 have inverted borrow chains. The subtractor circuits 160 which have inverted borrow chains will be referred to herein as negative logic portions of the subtractor block 58. The other subtractor circuits 160, for example, subtractor circuits 180, 182, 188 and 190 shown in FIG. 7, which do not have the borrow chain inverted will be referred to herein as positive logic portions of the subtractor block 58. The effect of the negative logic portion is compensated for in a manner described below.

The output of the subtractor block 58 on bus 68 is connected to the input of three comparator circuits 70, 72 and 74 as described above with reference to FIG. 2. A logic diagram of the almost full comparator block 72 is shown in FIG. 7. The comparator block 72 includes 12 comparator circuits 172. The comparator circuit 172 for comparing the least significant bit is shown on the lefthand side and designated as element 200 in FIG. 7. The comparator circuits 172 for the next succeeding significant bits are comparator circuits 202, 204, 206, 208, 210, 212 and the comparator circuit 214 compares the most significant bit in the compare block 72.

The comparator circuit 200 has its Gi-1 input, shown as G-1 in FIG. 7, connected to ground. Its Gi output, shown as G0, is connected to the Gi-1 input of comparator circuit 202. The Gi output, shown as G1, of comparator circuit 202 is connected to the input of an inverter 216, the output of which is connected to the Gi-1 input, shown as G1, of the comparator circuit 204. In a similar manner, inverters 216 are connected between the Gi outputs of every second comparator circuit 172 and the G-1 inputs of the next comparator circuit 172 in the comparator chain to amplify and invert the signal path between every other comparator circuit 172 and its next succeeding circuit. The inverters 216, like the inverters 196, operate to amplify and invert the signal between the comparator circuits 172 since the comparator circuits 172 consist only of transmission gates without amplification.

The effect of the inverters 216 is to cause the compare signal Gi through the comparator block 72 to be inverted in every other set of two comparator circuits 172. Thus, in FIG. 7, the comparator circuits 204, 206, 212 and 214 have inverted compare signals Gi. The comparator circuits 172 which have inverted compare signals of Gi will be referred to herein as negative logic portions of the comparator block 72. The other comparator circuits 172, for example, comparator circuits 200, 202, 208 and 210 shown in FIG. 7, which do not have their compare signal Gi inverted will be referred to herein as positive logic portions of the comparator block 72. The bit positions of the negative and positive logic portions of the subtractor block 58 corresponds to the bit positions of the negative and positive logic portions of the comparator block 72. The effect of the negative logic portion of the comparator block 72 is compensated for in a manner described below. A final inverter 218 is connected to the Gi output, shown as G11, of the comparator circuit 214 to amplify and invert the output signal on line 86.

On the bottom of FIG. 7 are the individual bits for the program value for the almost full flag with the most significant bit at the right and the least significant bits at the left in FIG. 7. The program value for the almost full register 72 is 2041, which in binary format, means that the most significant bit and the second and third least significant bits are binary 0s with the remaining bits being binary 1s. The algorithm for the connection between the individual subtractor circuits 160 and the individual comparator circuits 172 is to connect the Di output from the subtractor circuit 160 to the Xi input of the comparator circuit 172 and to connect the DBi output from the subtractor circuit 160 to the XBi input of the comparator circuit 172 if the program value for the particular bit is a binary 0; and if the program value is a binary 1, to connect the Di output of the subtractor circuit 160 to the XBi input of the comparator circuit 172 and to connect the DBi output of the subtractor circuit 160 to the Xi input of the comparator 172. These connections are advantageously made in one embodiment in the metal layer to facilitate programming of the program value. In the preferred embodiment of the present invention, the connections are made by a program select decoder as described hereinafter.

The algorithm for the connection of the Pi inputs to the comparator circuits 172 is to connect VCC to Pi if the program value is logic 1 and the comparator circuit 172 is in the positive logic portion of the comparator block 72, and to ground the Pi input if the program value is a 0. If the comparator circuit 172 is in the negative logic portion of the comparator block 72, the Pi input is connected to ground for a program value of binary 1, and is connected to VCC for a program value of binary 0. In this manner, the effect of the negative logic portions of the subtractor block 58 and the comparator block 72 are compensated for.

The operation of the comparator block 72 and subtractor block 58 as shown in FIG. 7 can be understood by starting with the GOUT signal on line 86. The GOUT signal on line 86 will be a logic 1 level if the program value is greater than the difference from the subtractor block 58. If the program value is equal to or less than the difference, then GOUT on line 86 will be a logic 0 level. Consider the case immediately following the reset of the FIFO memory 10. Under this condition, the output of the subtractor block 58 will be a logic 0 level, i.e., the Di outputs of the subtractor circuits 160 will be a logic 0 level and the DBi outputs will be a logic 1 level. Working back from the GOUT signal on line 86, the output of the comparator circuit 214 will be the same as the G10 input to the comparator circuit 214 since the comparator will pass its Gi-1 input to its Gi output. The G10 output from the previous stage will be provided by a comparator which will be configured the same as the comparator circuit 212. Since the difference inputs from the subtractor circuit 160 providing the X10 and X10B inputs to the comparator are interchanged (thereby inverting the outputs from subtractor circuit 110) because the programmed value for bit 10 is a logic 1, the G10 output from the comparator 172 for the second most significant bit will be the same as its P10 input which, because the programmed value is a logic 1 and the comparator is operating in a negative logic portion will be ground. Thus, the output of this comparator, G10, will be a logic 0 level which will be passed by the comparator circuit 214 to the input of the inverter 218 which will be inverted to place a logic 1 level on the GOUT line 86.

The GOUT line 86 will remain a logic 1 level for all differences out of the subtractor block 58 which are less than the program value. For each of these values, at least one of the comparator circuits 172 other than comparator circuits 202, 204 and 214 will have its Pi input connected to its Gi output to cause the GOUT signal on line 86 to be a logic 1 level.

When the difference out of the subtractor block 58 equals the program value then each of the comparator circuits 172 will have signals on their Xi and XBi inputs such that the Gi-1 inputs will be passed to the Gi outputs and the ground connected to the G-1 input of the comparator circuit 200 will be passed through the comparator chain after the inversions by the inverters 216 and the inverter 218 to place a logic 0 signal on line 86. The number of inverters 216 plus the inverter 218 forms an even number; thus, the ground input at the comparator circuit 172 forms a logic 0 at the line 86.

When the difference out of the subtractor block 58 is 1 greater than the program value, then the comparator circuit 202 will place the ground input on the P1 input onto the G1 output and the state of the comparator circuit 200 will be ignored. Thus, the GOUT signal on line 86 will remain a logic 0. For all other greater difference values out of the subtractor block 58, either the comparator circuit 202, 204 or 214 will place its Pl input onto its Gi output, and the GOUT signal on line 86 will be a logic 0 level.

Figure 8:
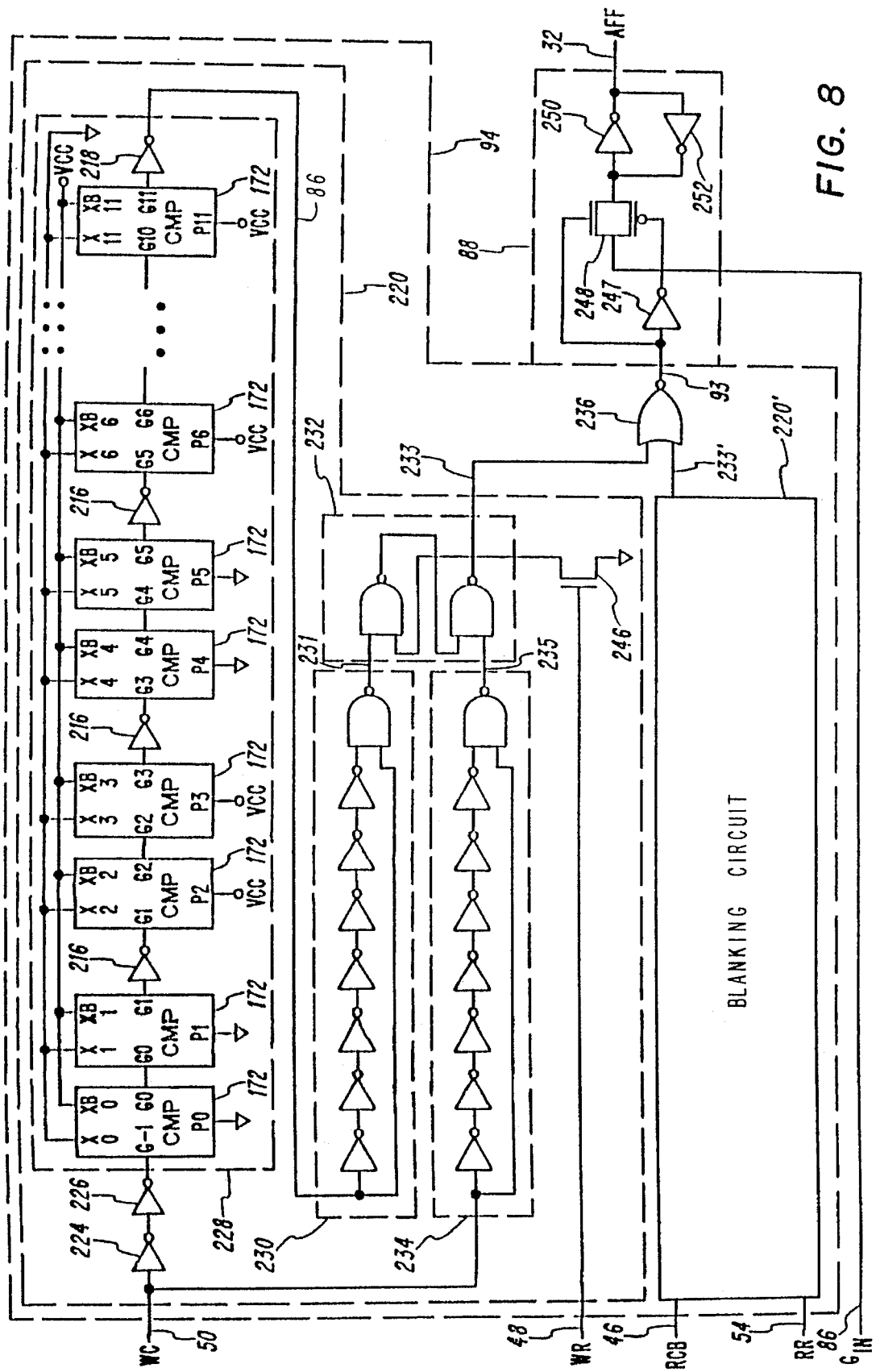
FIG. 8 is a logic diagram of a deglitching circuit and latch shown in FIG. 2.

Turning now to FIG. 8, a logic diagram of the deglitch circuit 94 and the latch circuit 88 is shown. The deglitch circuit 114 and the latch circuits 84, 92, 108 and 111 have the same schematic as the deglitch circuit 94 and the latch circuit 88 shown in FIG. 8. The WC clock signal on line 50 is connected to the input of a blanking circuit 220. The clock input on line 50 of the blanking circuit 220 is connected to the input of a first inverter 224, the output of which is connected to the input of a second inverter 226.

The output of the inverter 226 is connected to the G-1 input of a first comparator circuit 172 in a comparator block 228. The comparator block 228 is the same circuitry as the comparator blocks 70, 72, 74, 98 and 100 with the Xi inputs of the comparator circuits 172 connected to ground and the XBi inputs connected to VCC. The output of the comparator block 228 is connected to the input of a one-shot 230, the output of which on line 231 is connected to one input of an RS flip-flop 232 formed by the cross-coupled arrangement of two NAND gates. The clock input on line 50 is also connected to the input of a second one-shot 234, the output of which on line 235 is connected to the second input of the RS latch 232. The output of the RS latch 232 on line 233 is connected to one input of a NOR gate 236, the output of which forms the output of the deglitch circuit 94 on line 93 as shown in FIG. 2. This output on line 93 is connected to the clock input of the latch 88. The D input to the latch 88 is on the line 86 shown as GIN in FIG. 8 which is also the GOUT line 86 shown in FIG. 7. A reset signal WR on line 48 is connected to the gate of an n-channel transistor 246 which operates to pull the output on line 233 of the RS latch 232 to ground during a write reset operation.

The second input to the NOR gate 236 is driven by the output from a second blanking circuit 220'. The blanking circuit 220' is the same circuit as the blanking circuit 220, and has connected to its clock input the RCB signal on line 46, and connected to its reset input is the RR signal on line 54.

The clock input of the latch 88 is connected to the input of an inverter 247 and to the n-channel gate of a transmission gate 248. The output of the inverter 247 is connected to the p-channel gate of the transmission gate 248. The D input of the latch 88 which, in FIG. 8, is the GIN signal on line 86 is passed through the transmission gate 248 and to the input of an inverter 250, the output of which forms the almost full flag signal, AFF, on line 32. Another inverter 252 has its input connected to the output of the inverter 250 and its output connected to the input of the inverter 250 to form the latch portion of the latch 88. Although for simplicity a single clock signal on line 93 from the output of the NOR gate 236 to the clock input of the latch circuits 88 is shown in FIGS. 2 and 8, it will be understood that in the preferred embodiment, the inverter 247 is part of the deglitch circuit 94 and two clock lines consisting of the output of the NOR gate 236 and the inverter 247 is routed to leach of the latches 88.

The operation of the deglitch circuit 94 shown in FIG. 8 will now be described with reference to FIG. 9. During the time that the FIFO memory 10 is not receiving a read clock or a write clock, the output of the NOR gate 236 is a logic 1 level, transmission gate 248 is conductive, and the GIN signal on line 86 is passed through the inverter 250 to the AFF signal output on terminal 32. Upon receipt of the rising edge of the write clock signal on line 50, the one-shot 234 produces a pulse at its output on line 235 as shown in FIG. 9. This output pulse on line 235 sets the RS latch 232 output on line 233 to a logic 1 level, also shown in FIG. 9. This logic 1 level at node 233 causes the transmission gate 248 to be non-conductive; therefore, any changes on the GIN line 86 are ignored with the inverters 250 and 252 preserving the previous state of the AFF signal until the transmission gate 248 is again enabled. The rising edge of the write clock signal on line 50 is passed through the inverters 224 and 226 which compensate for the delay through the write counter block 40.

It will be understood that additional pairs of inverters may be put in series with the inverters 224 and 226 if required to compensate for the delay through the write counter block 40. The output from the inverter 226 is fed through the comparator chain 228 to match the delay through the subtractor block 58 and the comparator blocks 70, 72 and 74. Advantageously, the data flow through both the subtractor block 58 and the comparator blocks 70, 72 and 74 is in parallel moving from the left to the right in FIG. 7 and, therefore, the delays are not cumulative, but rather consecutive. The rising edge of the output from the comparator block 228 fires the one shot 230 to produce a pulse at its output node 231 which resets the RS latch 232 as shown in FIG. 9. Thus, at the time the RS latch 232 is reset, the transmission gate 248 is again enabled if the transmission gate 248 is not being simultaneously disabled by the operation of the deglitch circuit 220'.

The operation of the blanking circuit 220' is the same as the operation just described for the blanking circuit 220.

Also shown in FIG. 9 is one of the bits, bit 0 for example, from bus 56 which is the WQ output from the write counter 40. As shown in FIG. 9, the data bit on bus 56 changes at the rising edge of the write clock pulse. In contradistinction, one of the bits, for example bit 0, on bus 66 which is in the RQN output from the read counter 42 changes on the trailing edge of the read clock bar signal as shown in FIG. 9. The one shots 230' and 234' (like the one shots 230 and 234) ignore the falling edge pulses at their input which is the leading edge of the read clock bar signal, and thus, the state of the RS latch 232' does not change until the trailing edge of the read clock bar signal is detected. Upon this rising edge on the trailing edge of the read clock bar signal, the one shot 234' sets the RS latch 232' to make non-conductive the transmission gate 248, and the delayed trailing edge of the read clock bar signal then fires the one shot 230' to reset the RS latch 232' to again make conductive the transmission gate 248 assuming that the blanking circuit 220 is not at the same time keeping the transmission gate 248 from being conductive. The outputs from the one shot 230' on line 231' and the one shot 234' on line 235' and the output from the RS latch 232' on line 233' are also shown in FIG. 9.

The flag generation circuit 12 described above provides an output signal indicative of the time delay between two asynchronous clock signals. This indication is produced by comparing the relative difference between the two asynchronous pointers and a preset value. This circuitry allows for generation of multiple status flags using the same basic circuitry. Also, only one set of counters is necessary to accommodate the various flags.

The matching of the propagation delay through the subtractor blocks 58 and 62 with the propagation delay through the comparator blocks 70, 72, 74, 98 and 100 and the parallel operation through these blocks as opposed to serial operation of two blocks, allows for fast clock cycle times. The propagation delays are matched since the signal path for the borrow chain in the subtractor blocks 58 and 62 is matched to the signal path for the comparator blocks 70, 72, 74, 98 and 100. These signal paths consist of an equal number of transmission gates and inverters.

Moreover, the flags generated by the above circuitry are free of catastrophic arbitration programs because the generation of the flag is dependent on a continuous signal based on the current state of the counters and not an instantaneous event such as sampling of the status of two counters after a read pulse or a write pulse as is done in some prior art circuits. The program values are easily programmed in metal-1 or metal-2 allowing for easy modification of these program values.

The present invention makes use of the foregoing circuitry for detecting the relative difference between two asynchronous pointers, but additional circuitry is added to make the binary program value user-programmable, as opposed to metal-programmable. The subtractor and comparator circuits of FIGS. 5, 6 and 7 are utilized for detecting a given flag value. As previously described, when a given program bit Pi is to equal a logic 0, then Xi is connected to Di (the corresponding difference bit from the subtractor), and Xi complement (XBi) ties to Di complement (DBi). When the program bit Pi is a logic 1, the Di and Di complement (DBi) connections are switched relative to Xi and xt complement (XBi). When negative logic is used, Xi and Xi complement (XBi) connections are not affected, but the program value is inverted.

Figure 10:
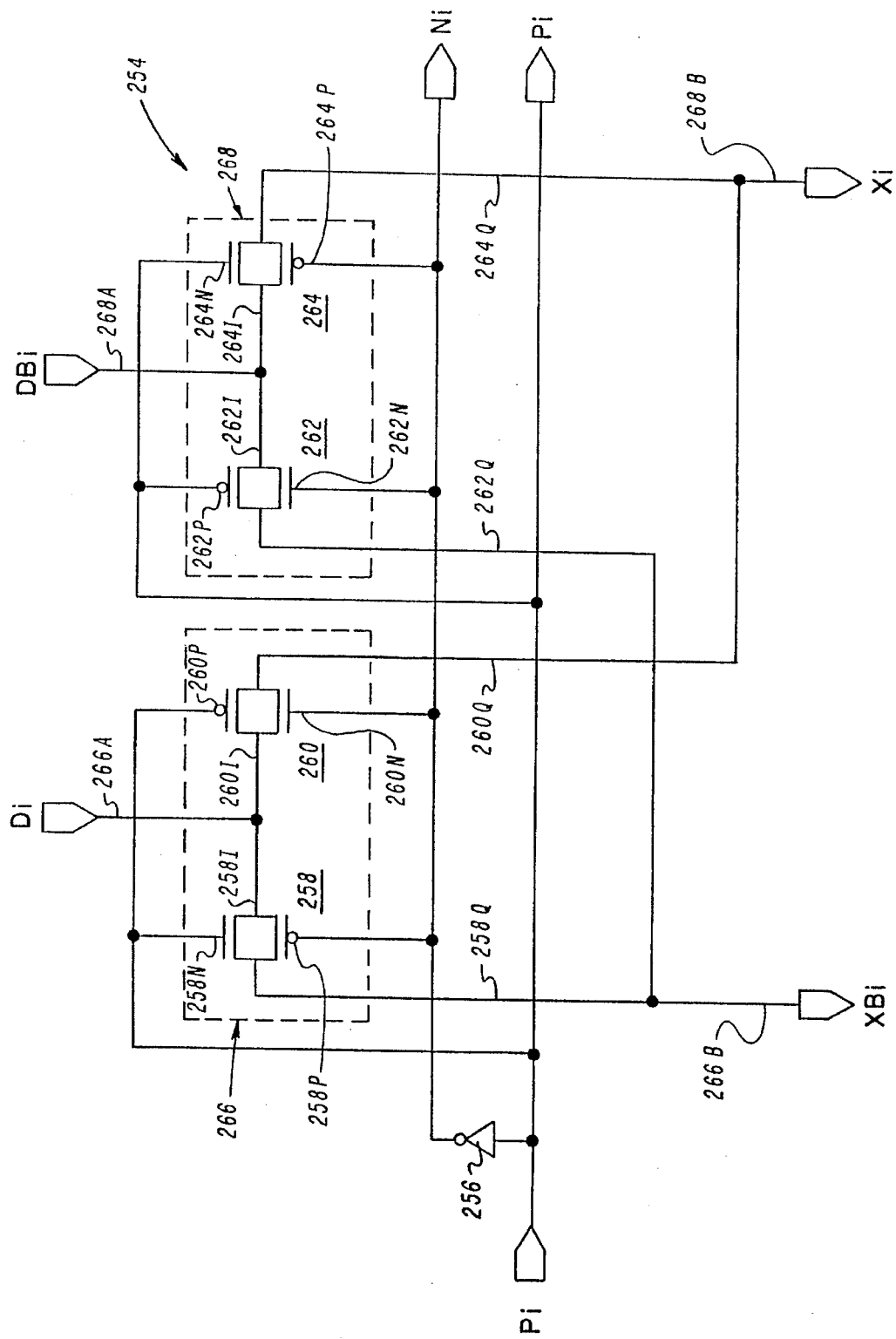
FIG. 10 is a circuit diagram of a comparator program select circuit which makes a binary flag user-programmable; and, FIG. 11 is a circuit diagram showing the comparator program select circuit of FIG. 10 interconnected in the subtractor/comparator circuit of FIG. 7.

The algorithm for the connection between the individual subtractor circuits 160 and the individual comparator circuits 172 is to connect the Di output from the subtractor circuit 160 to the Xi input of the comparator circuit 172 and to connect the DBi output from the subtractor circuit 160 to the XBi input of the comparator circuit 172 if the binary value of the particular program bit Pi is a binary 0; and if the binary value of Pi is a binary 1, to connect the Di output of the subtractor circuit 160 to the XBi input of the comparator circuit 172 and to connect the DBi output of the subtractor circuit 160 to the xi input of the comparator 172. The foregoing connections are made automatically, according to the preferred embodiment of the present invention, by the program select decoder circuit 254 as illustrated in FIG. 10.

Figure 11:
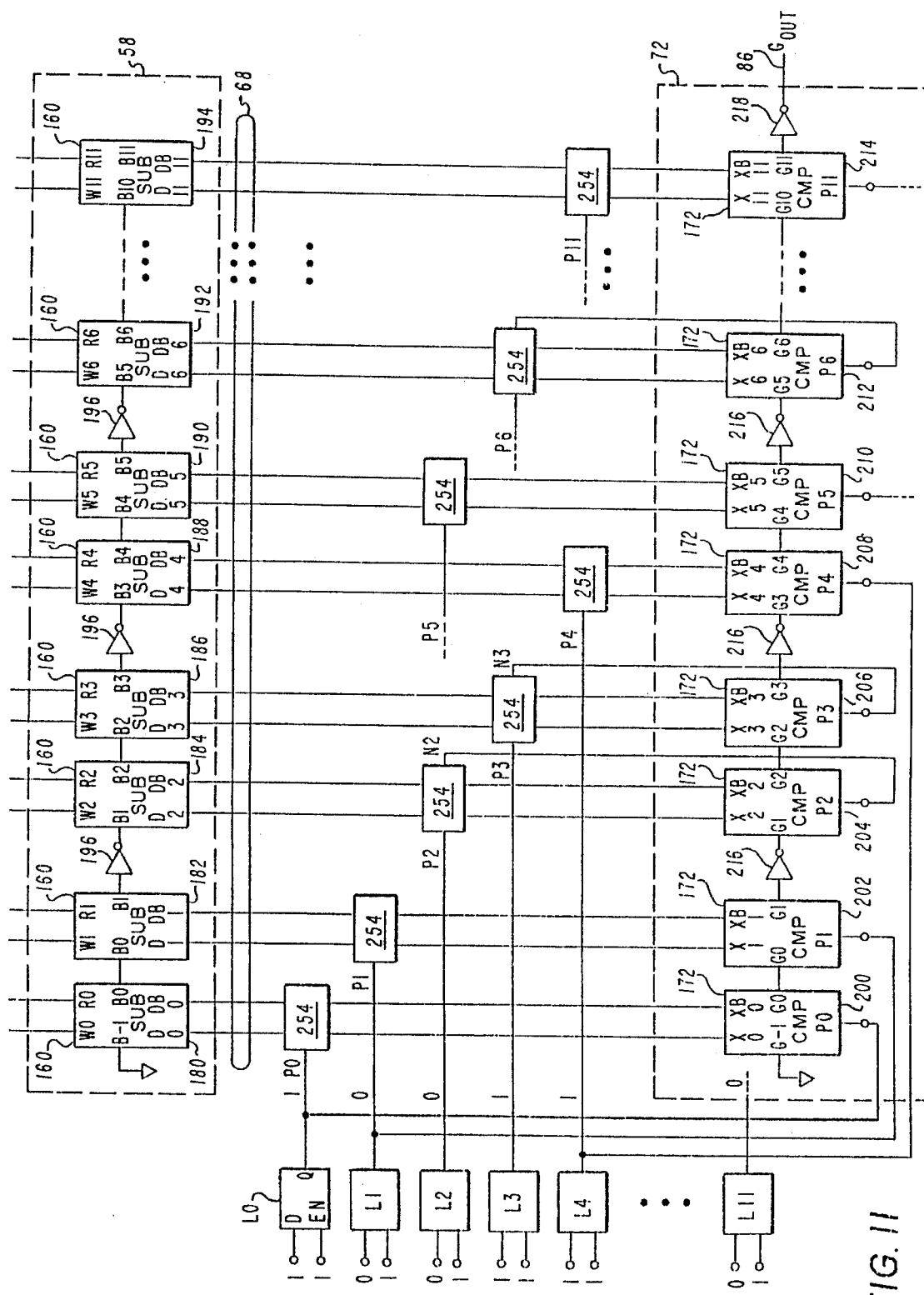

To make the circuit user-programmable, the program Pi, the Xi true and Xi complement (XBi) connections must be alterable. Referring to FIGS. 10 and 11, the program select decoder 254 is connected to receive a program value Pi. The flag program value Pi is stored into registers, for example, D latches L0, L1, . . . , L11 that correspond to each bit of the flag binary value desired. The output of the i'th register is Pi. Pi is inverted by inverter 256 to generate Ni. Pi and Ni control transfer gates 258, 260, 262 and 264 which selectively pass Di and Di complement (DBi) to Xi true and Xi complement (XBi), respectively. When Pi is a logic 0, Xi is connected to Di and Xi complement (XBi) is connected to Di complement (DBi). When the Pi is a logic 1, Xi is connected to Di complement and Xi complement (XBi) is connected to Di. Pi is also connected to the positive logic magnitude comparator program input. Ni is connected to the negative logic magnitude comparator program input. As a result, all requirements are met to properly produce a flag of a given program value.

Referring again to FIG. 10, the transfer gate circuits 258, 260 are interconnected to define a first transmission gate 266, and the transfer gate circuits 262, 264 are interconnected to define a second transmission gate 268. The first transmission gate 266 includes an input 266A coupled to receive the true difference signal Di, and an output 266B coupled to the complement signal Xbi of the comparator circuit. Likewise, the second transmission gate 268 includes an input 268A coupled to receive the complement difference signal Dbi and an output 268B coupled to the true signal input Xi of the comparator circuit. The transfer gate circuits 258, 260 have inputs 258I, 260I, respectively and outputs 258Q, 260Q, respectively. Moreover, the transfer gate circuits have P-channel control gates 258P, 260P, respectively and N-channel control gates 258N, 260N, respectively. The P-channel and N-channel control gates 258P, 260N are cross coupled and are connected in common to receive a complement program bit signal Ni, while the N-channel and P-channel control gates 258N, 260P are cross coupled and connected in common to receive the true program bit signal Pi. The transfer gate circuit outputs 258Q, 260Q are connected to the transmission gate outputs 266B, 268B, respectively. In the second transmission gate 268, the N-channel and P-channel control gates 266N, 264P are likewise cross coupled and connected to receive the complement program bit signal Ni, while the N-channel and P-channel control gates 264N, 262P are cross coupled and connected in common to receive the true program bit signal Pi. The transfer gate circuit outputs 262Q, 264Q are connected to the transmission gate outputs 266B, 268B, respectively.

Although well suited for the needs of FIFO memories, the present invention is equally well suited for usage in other areas where detection of the magnitude of the relative difference between two pointers is needed. One example is RISC microprocessor register windows. These registers store local and global variables and use pointers to designate window location. This eliminates the need for extra load and store instructions to transfer data from register to register. The magnitude of the relative difference between various pointers could provide useful information about the state of the information being used and how future operations could be performed in an optimum manner. Some systems may require that this difference threshold be varied on the fly, depending on the operation being performed, in which case a user-programmable flag would be desirable.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. A method for providing an output signal indicative of the difference between a first and a second clock signal which are asynchronous with respect to each other, comprising the steps of:

counting the number of first clock pulses of said first clock signal in a first counter, and the number of second clock pulses of said second clock signal in a second counter;

subtracting the count of said first counter from the count of said second counter to generate a difference value;

comparing the difference value generated in said subtracting step to a predetermined number; and causing said output signal to be a first logic level if said difference is greater than said predetermined number.

2. The method of claim 1, further comprising the step of:

repeating said subtracting, comparing, and causing steps for each received first or second clock pulse.

3. The method of claim 1, further comprising the step of:

storing the predetermined number used in said comparing step.

4. The method of claim 1, further comprising the step of:

causing said output signal to be a second logic level if said difference is less than said predetermined number.

5. The method of claim 4, further comprising the step of:

causing said output signal to be the second logic level if said difference is equal to said predetermined number.

6. The method of claim 4, further comprising the step of:

causing said output signal to be the first logic level if said difference is equal to said predetermined number.

7. Apparatus for providing an output signal indicative of the difference between a first and a second clock signal which are asynchronous with respect to each other, said apparatus comprising:

a first counter for counting a number of first clock pulses of said first clock signal, and a second counter for counting a number of second clock pulses of said second clock signal;

a subtractor circuit for providing a difference value between the count of said first counter and the count of said second counter;

a comparator circuit for comparing said difference value to a predetermined number; and an output circuit for providing an output of a first logic state if said difference value is greater than said predetermined number.

8. The apparatus of claim 7, further comprising:

a register connected to said comparator for storing the predetermined number.

9. The apparatus of claim 7, wherein the output circuit provides an output of a second logic state if the difference value is less than the predetermined number.

10. The apparatus of claim 9, wherein the output circuit provides an output of the second logic state if the difference value is equal to the predetermined number.

11. The apparatus of claim 9, wherein the output circuit provides an output of the first logic state if the difference value is equal to the predetermined number.

12. A method for generating an output signal indicative of the relative fullness of a FIFO memory, comprising the steps of:

counting a number of read clock pulses in a read counter, and a number of write clock pulses in a write counter;

subtracting the count of said read counter from the count of said write counter;

comparing a difference value generated in said subtracting step to a predetermined number; and causing said output signal to be a first logic level if said difference value is greater than said predetermined number.

13. The method of claim 12, further comprising the steps of:

reading a data value out of the FIFO memory for each read clock pulse which is counted; and writing a data value into the FIFO memory for each write clock pulse which is counted.

14. The method of claim 12, further comprising the step of:

causing said output signal to be a second logic level if said difference value is less than said predetermined number.

15. The method of claim 14, further comprising the step of:

causing said output signal to be the second logic level if said difference value is equal to said predetermined number.

16. The method of claim 14, further comprising the step of:

causing said output signal to be the first logic level if said difference is equal to said predetermined number.

17. A FIFO memory containing a block of circuitry for generating outputs which provide information regarding the relative fullness of said FIFO memory, said block of circuitry comprising:

a first counter for counting the number of read clock pulses received by said FIFO memory, and a second counter for counting the number of write clock pulses received by said FIFO memory;

a subtractor circuit for providing a difference between the count of said first counter and the count of said second counter;

a comparator circuit for comparing said difference to a predetermined number; and an output circuit for providing an output of a first logic state if said difference is greater than said predetermined number.

18. The apparatus of claim 17, further comprising:

a register connected to said comparator for storing the predetermined number.

19. The apparatus of claim 17, wherein the FIFO has a first number of memory locations, and wherein the predetermined number is less than or equal to the first number of memory locations.

20. The apparatus of claim 19, wherein the FIFO has a first number of memory locations, and wherein the predetermined number is equal to one-half the first number of memory locations.

21. The apparatus of claim 17, wherein the output circuit provides an output of a second logic state if the difference value is less than the predetermined number.

22. The apparatus of claim 21, wherein the output circuit provides an output of the second logic state if the difference value is equal to the predetermined number.

23. The apparatus of claim 21, wherein the output circuit provides an output of the first logic state if the difference value is equal to the predetermined number.

* * * * *